United States Patent [19]

Hennemann et al.

[11] Patent Number: 5,716,241
[45] Date of Patent: Feb. 10, 1998

[54] I/O DEVICE FOR A DATA BUS

[75] Inventors: Lothar Roland Hennemann, Enger; Ralf Coors, Hille, both of Germany

[73] Assignee: WAGO Verwaltungsgesellschaft mbH, Minden, Germany

[21] Appl. No.: 374,312

[22] Filed: Jan. 18, 1995

[30] Foreign Application Priority Data

Jan. 18, 1994 [DE] Germany ............... 44 02 002.3

[51] Int. Cl.⁶ ......................................... H01R 9/26
[52] U.S. Cl. ............................... 439/716; 439/76.1
[58] Field of Search ............................... 439/709, 710, 439/712–716, 717, 76.1

[56] References Cited

U.S. PATENT DOCUMENTS

| | | | |
|---|---|---|---|
| 4,729,744 | 3/1988 | Bet et al. | |
| 4,926,149 | 5/1990 | Saens et al. | 439/716 |
| 4,956,747 | 9/1990 | Beer et al. | 439/717 X |
| 5,180,318 | 1/1993 | Moller et al. | 439/716 |
| 5,443,404 | 8/1995 | Matsuoka | 439/717 X |

*Primary Examiner*—Khiem Nguyen
*Attorney, Agent, or Firm*—Salter & Michaelson

[57] ABSTRACT

The invention relates to I/O devices for a data bus, which are configured as series terminals having an I/O electronic means installed therein (so-called bus terminals). The terminals are locatable on commercially available support rails and form there a terminal bus. Incorporated in the bus terminals are, power supply lines. A power supply electrically communicates with the power supply lines, the lines being automatically contacted or slipped therethrough upon location on the support rail.

4 Claims, 3 Drawing Sheets

I/O DEVICE FOR A DATA BUS

BACKGROUND AND SUMMARY OF THE INVENTION

The invention relates to an input/output device for a data bus, such as is offered as a so-called field bus by various manufacturers in conjunction with special processor systems, industrial computers, etc., e.g. for the controlling, visualising or the like of process sequences, machines, installations and for system building techniques.

The field bus concept represents a rational type of wiring for machines and installations, etc. The input/output devices (I/O devices) are provided with terminal points for the parallel wiring of the individual bus parts, which may be actuators, sensors and other appliances as well. The wiring may be achieved by any desired connection technique, e.g. by a one-, two-, three- or four-conductor technique. Spring tension terminals, which are particularly easy to operate, or even screw terminals, are suitable for the terminal points.

The devices are provided with an I/O electronic means, which connects the parts, communicating with the terminal points of the devices, to the serial data bus line, which may be a simple two-wire line or even a light-wave conductor cable, for example. In such case, this data bus line, which communicates with the I/O devices, is mainly, in practical usage, an independent sub-bus in the topology of a ring, which is coupled to the field bus (remote bus) via a bus master. The bus master controls the individual I/O devices, which may be combinable with one another in any sequence and may be disposed in a ring in any desired positions.

It is known to locate I/O devices on commercially available support rails. It is also known to establish automatically the connection with the data bus line and with the power supply lines simultaneously with the locating operation, such connection supplying the I/O electronic means with the usual voltage, substantially 24 V DC. For this purpose, individual printed circuit boards, which are interconnected to form a so-called supply rail, are mounted on the base of the usually hood-shaped support rails. In addition to the two conductors for the power supply, three additional conductors for the data bus are available on the supply rail. The contacting of the conductors is effected via bush contacts, which are fixedly installed in the supply rail at a predetermined distance.

Such a supply rail, which is incorporated into the support rail, not only increases the financial outlay and assembly work for securing the support rails of the I/O devices (unused parts of the supply rail must be covered), but also prevents their modularity, since the width of the I/O devices must always be a multiple of the prescribed spacings between the bush contacts in the supply rail. The supply rail, which is disposed on the base of the support rail, also prevents the support rail itself from being secured on a mounting face on the like, since the screw holes required therefor are only permitted at quite specific locations on the supply rail, and such an arrangement is often not consistent in practical usage with the local circumstances.

With other known I/O devices, which can be located on support rails, the above-mentioned disadvantages are avoided, in that said devices are located in a reliable manner on the unchanged, commercially available support rails and the data bus lines as well as the power supply lines for the I/O electronic means extend from device to device in the form of a plug-in-type flat-strip cable. For the user, however, this arrangement involves somewhat complex and time-consuming assembly work, and the manufacturer of this system has in fact decided, for this reason, to offer only very wide I/O devices having 16, 24 and 32 inputs or outputs, which lie adjacent one another in the direction of the support rails. The modularity of the system is thereby largely lost.

An object of the prevent invention is to provide I/O devices with a high degree of modularity, such devices having to be located on unchanged, commercially available support rails in a very simple manner, but at the same time the connection with the data bus lines and power supply lines is to be established automatically during the locating operation.

This object is achieved, according to the invention, in that the I/O devices are configured as series terminals having an incorporated or mountable electronic means, such devices being locatable on the support rail in a manner known per se as separate individual terminals or in a group of several as a terminal block (called bus terminals hereinafter), in that both the data bus lines and the power supply lines for the I/O electronic means are incorporated in the bus terminals and are slipped therethrough, in that each individual bus terminal and each terminal block have pressure contacts (called bus contacts hereinafter) in their lateral faces extending towards the neighbouring terminals such that the bus contacts automatically contact one another in the series direction of the bus terminals when the bus terminals are located on the support rail, so that the bus terminals, which are located on the support rail, are connected to traversing data bus lines and power supply lines to form a terminal bus.

The bus terminals of the invention can easily be located on a commercially available support rail and are thereby automatically connected to data bus lines and supply lines, which have been slipped therethrough, to form a terminal bus. The user does not need to effect any additional assembly work therefor.

The degree of modularity of the new bus terminals is particularly high, since each individual bus terminal only ever represents one I/O component part and each has its own I/O electronic means, which is installed in the housing of the individual bus terminals, which housing is formed from insulating material. In such case, the width of such a bus terminal corresponds to the conventional width of a series terminal, and it has the same technique, usual for series terminals, for being located on the support rail and has the same connection technique in respect of the terminal points for wiring the bus parts. In consequence, the bus terminal of the invention is basically a series terminal, such as is familiar to the user with its known assembly and wiring work.

This also applies when two, three or more of the new individual bus terminals are combined to form a bus terminal block, which combination may be effected by the manufacturer or the user, so that in practical usage 2- or 3-module devices, etc. can be used in addition to the 1-module device, in order to locate a terminal bus of any desired length and any desired configuration on a commercially available support rail.

The terminal bus can be retained by means of end brackets secured on the support rail, as is known for series terminals. This arrangement ensures that the contact pressure of the bus contacts between the bus terminals does not displace the terminal bus on the support rail.

For the same purpose, one particularly advantageous embodiment of the invention provides that the bus terminals have, on their lateral faces, projection members and sockets, which correspond to the neighbouring terminals and engage in one another when the bus terminals are mounted on the support rail, said projection members and sockets interconnecting the bus terminals in the series direction of the terminals in a mechanically tension-resistant manner. Such projection members and sockets may be rectilinear or arcuate, depending on the desired mounting or locating movement of the bus terminals on the support rail.

A further improvement in the design and operation of the bus terminals according to the invention is characterised in that—starting from a special supply terminal, such as is known for series terminals—power for the parts communicating with the terminal points of the bus terminals is supplied by means of power bridging members, which are fixedly disposed on the lateral faces of each individual bus terminal and each bus terminal block, and which engage automatically in one another when the bus terminals are mounted on the support rail.

Such power bridging members, which are fixedly disposed on the bus terminals and close automatically, are new and facilitate considerably the assembly of a terminal bus on the support rail.

The power bridging members each comprise a knife-like contact and a resilient fork-like contact, such contacts being provided alternately on the lateral faces of the bus terminals and engaging in one another in the transverse direction when the bus terminals are mounted on the support rail, i.e. the knife-like contact travels transversely between the two U-shaped legs of the resilient fork-like contact. This ensures, on the one hand, that there is a high contact pressure between the knife-like contact and the fork-like contact and, on the other hand, that this contact pressure does not act in the series direction of the terminal bus, so that the high contact pressure of the power bridging members does not tend to displace the terminal bus on the support rail.

A particularly advantageous embodiment of the invention provides that the power bridging members form the end-pieces of a bar-like flat rail, which end-pieces extend internally through the individual bus terminals and the bus terminal blocks, so that there is also no bridging between the individual bus terminals of a bus terminal block.

BRIEF DESCRIPTION OF THE DRAWINGS

Embodiments of the invention are described more fully hereinafter with reference to the drawings. In the drawings.

DETAILED DESCRIPTION OF THE PREFERRED EMBODIMENT

Figure 3:
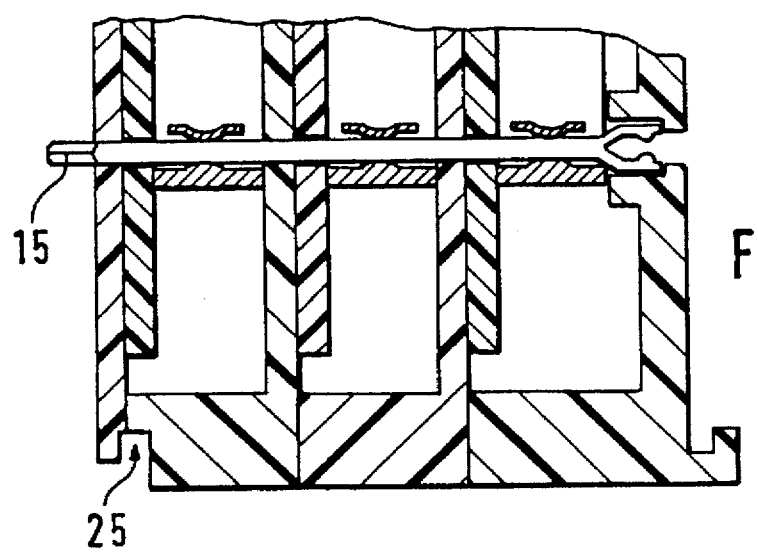

FIG. 3 Illustrates two bus terminal blocks of the invention, each comprising three individual bus terminals, as so-called 3-module devices.

Figure 1:
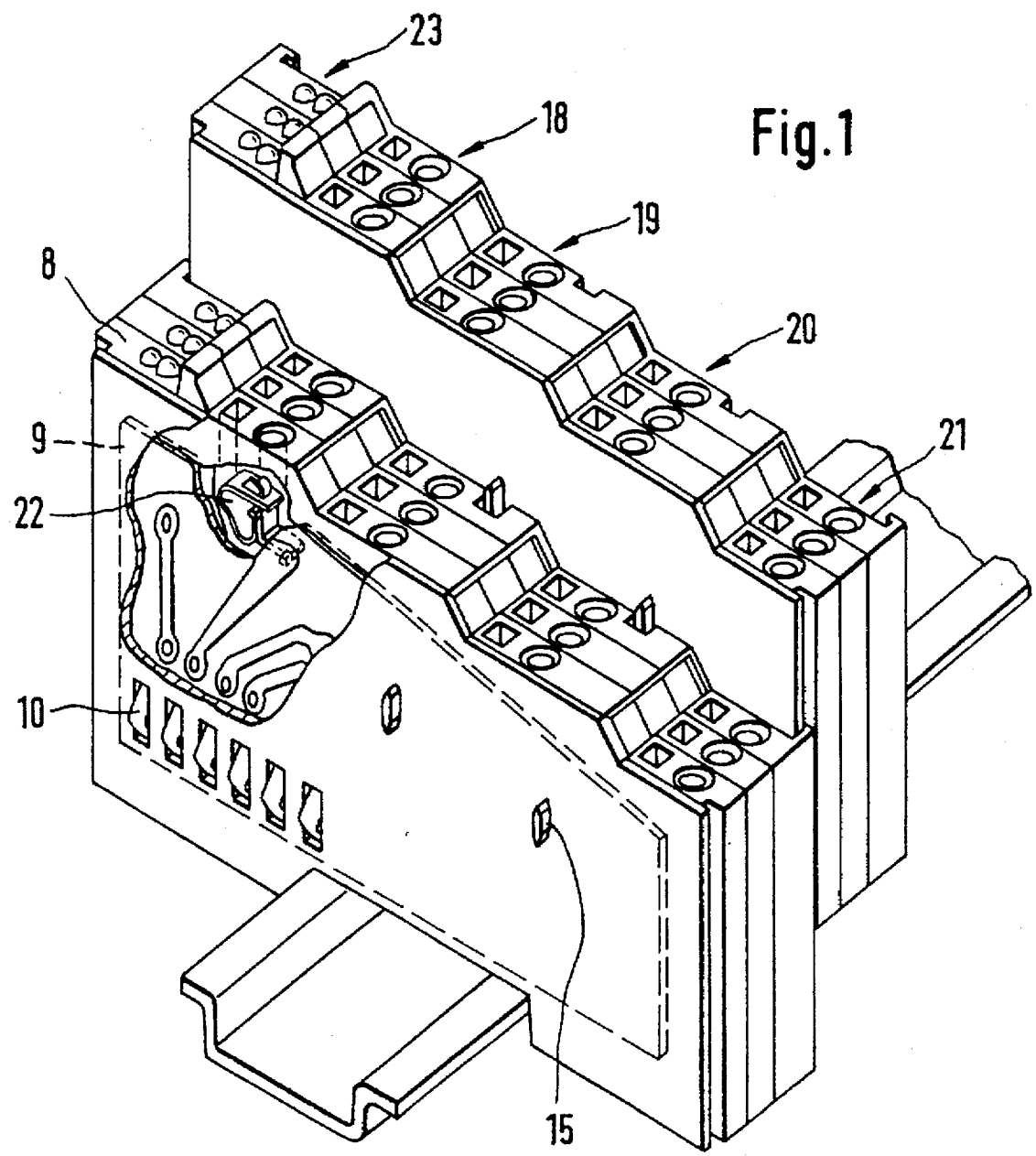
FIG. 1 is a perspective view of two bus terminal blocks according to the invention.

Each individual bus terminal has an I/O electronic means, which is installed in the housing 8, formed from insulating material, and can be seen in FIG. 1 in the form of an equipped printed circuit board 9.

Figure 2:
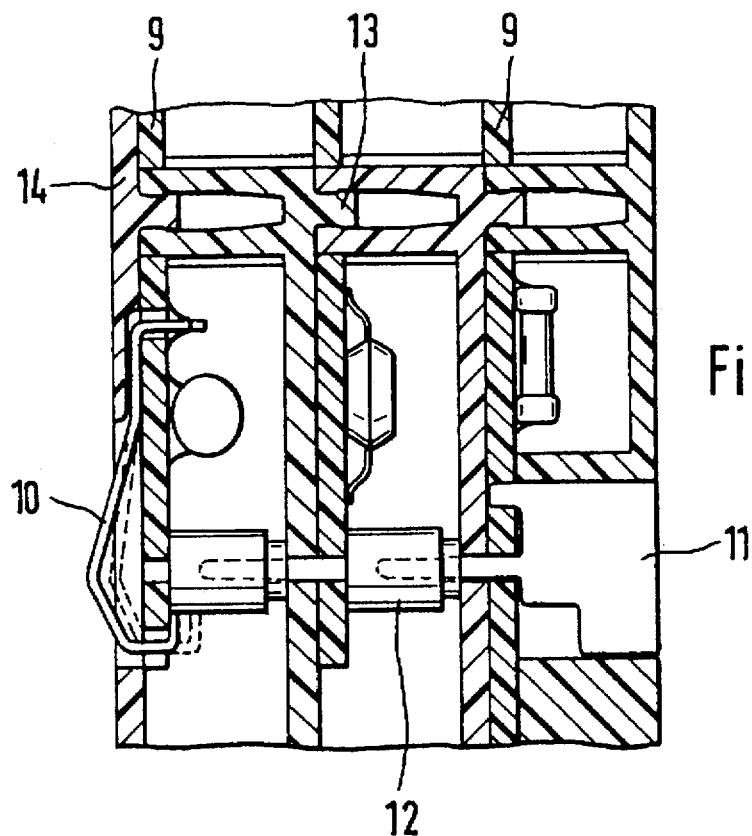
FIGS. 2 and 3 are partial cross-sectional views through the bus terminal block of FIG. 1.
Figure 4:
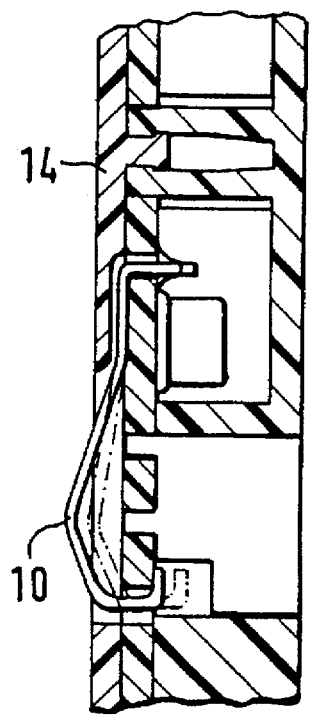
FIGS. 4 and 5 are partial cross-sectional views through the bus terminal block of FIG. 1.
Figure 6:
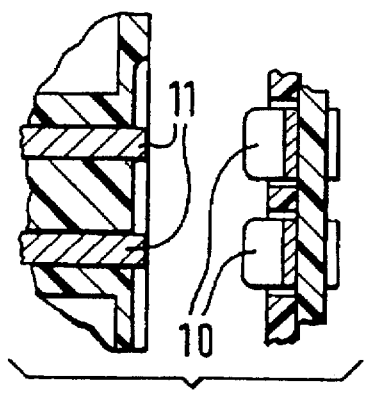
FIG. 6 is a detailed cross-sectional view of FIGS. 2 and 4.

Each printed circuit board 9 has, and is electrically connected to, bus contacts which are provided on one lateral face of the bus terminals as resilient pressure tabs 10 and on the oppositely situated lateral face of the bus terminals as fixedly disposed contact webs 11 (compare FIG. 2 and FIG. 4). FIG. 6 is a cross-sectional view from above of the contact webs 11, and the contact tabs 10 are accordingly shown on the oppositely situated side of the neighbouring terminal.

Generally, the illustrated individual bus terminals (compare FIGS. 4 and 5) and the illustrated bus terminal blocks (compare FIG. 1 with FIG. 2 and FIG. 3) each have six bus contacts on each lateral face of their housing formed from insulating material. This corresponds to the lines, which are incorporated in the bus terminals and are slipped therethrough, two lines of which are provided on the respective printed circuit boards 9 of the bus terminals for the supply of power to the I/O electronic means, and the remaining four lines are data bus lines (when the data bus has an annular topology, two data lines extend in one forward direction and two data lines extend in the opposite backward direction).

FIGS 2 and 4 indicate clearly that these lines are slipped through the bus terminal block and through the individual bus terminal. In the case of the bus terminal block, pin bushes 12 are provided therefor, so that the disc-like individual terminals can be combined in a very simple manner to form any desired 2-, 3- or other multi-module device. The strong push-button locating means 13 of the housing made from insulating material are also intended for this purpose. The end-plates 14 of insulating material terminate each individual bus terminal and each bus terminal block FIGS. 2 and 4).

Figure 5:
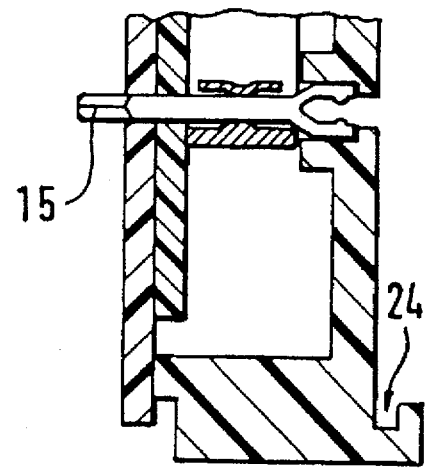
Figure 7:
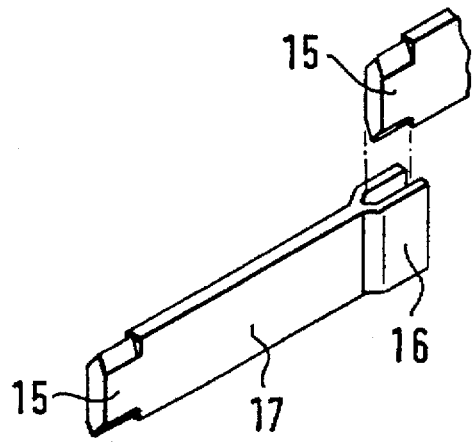
FIG. 7 is a detailed view of FIGS. 3 and 5.

FIGS. 3, 5 and 7 illustrate the design and disposition of the power bridging members, each comprising a knife-like contact 15 and a resilient fork-like contact 16, which form the end-pieces of a bar-like flat rail 17 extending through the individual bus terminal (FIG. 5) and through the bus terminal block (FIG. 3). As FIG. 1 illustrates, the power bridging members 15 and 16 are disposed at an adequate spacing from the bus contacts 10 and 11, since they serve to supply power to the parts (actuators, sensors, appliances) communicating with the terminal points of the bus terminals and can conduct a substantially higher voltage potential than the bus contacts.

The terminal points for the parallel wiring of the bus parts are accessible from above, as illustrated in FIG. 1. In this embodiment, a signal connection 18, a (+) connection 19, a (−) connection 20 and a protective conductor connection 21 are provided for each part. Each terminal point is configured in known manner as a spring terminal 22 end requires no further description. Light-emitting diodes 23 are provided above the signal connection and indicate the I/O status and any faults.

FIGS. 3 and 5, as well as FIG. 1, also show that the bus terminals are provided, on their lateral faces, with corresponding projection members 24 and sockets 25, which engage in one another when the bus terminals are mounted or located on the support rail and interconnect the bus terminals in the series direction in a mechanically tension-resistant manner.

What is claimed is:

1. An input/output device for a data bus, said device being located on a support rail and being adapted to be positioned adjacent other such devices, said device comprising a plurality of terminal points for the parallel wiring of bus parts, and electronic means which connects bus parts to a serial data bus line and a power supply line, wherein the improvement comprises:

configuring the device with other such devices as series terminals, each having said electronic means, each device being located on the support rail either singly so as to define individual terminals, or in a group so as to define a terminal block having bus terminals;

said data bus line and power supply line being incorporated in the bus terminals and being slipped therethrough;

each bus terminal having at least one pressure contact in a lateral face thereof which extend towards an adjacent terminal of an adjacently positioned device, the contact automatically contacting the device to an adjacent device in the series direction of the bus terminals so that the bus terminals, which are located on the support rail, are connected to traversing data bus lines and power supply lines to form said bus terminal; and at least one power bridging member for providing power to the parts communicated with the terminal points of the bus terminals, said power bridging member being fixedly disposed on the lateral face of the bus terminal and the terminal block, and engaging automatically with another power bridging member of an adjacent device when the bus terminals are mounted on the support rail.

2. The I/O device as set forth in claim 1, said power bridging member comprising a knife-like contact and a resilient fork-like contact, the contacts being provided alternately on the lateral faces of the bus terminals and engaging one another in the transverse direction when the bus terminals are mounted on the support rail.

3. The I/O device as set forth in claim 2, said power bridging member forming the end-pieces of a bar-like flat rail which extends internally through the individual bus terminals and the bus terminal blocks.

4. An input/output device for a data bus, said device being locatable on a support rail, and positioned adjacent other such devices, said device having terminal points for the parallel wiring of bus parts, and having an electronic means which connects parts to a serial data bus line, wherein the improvement comprises:

configuring the device as series terminals having an incorporated or mountable electronic means, such device being locatable on the support rail in a manner known per se as separate individual terminals or in a group of several as a terminal block;

data bus lines and power supply lines for the electronic means being incorporated in bus terminals and being slipped therethrough, each individual bus terminal and each bus terminal block having pressure contacts in lateral faces thereof which extend towards adjacent terminals;

bus contacts automatically contacting one another in the series direction of the bus terminals when the bus terminals are located on the support rail so that the bus terminals which are located on the support rail are connected to transversing data bus lines and power supply lines to form a terminal bus;

power bridge members for providing power to the parts communicating with the terminal points of the bus terminals, said members being fixedly disposed on the lateral faces of each bus terminal and each bus terminal block and engaging automatically one another when the bus terminals are mounted on the support rail, each bridging member comprising a knife-like contact and a resilient fork-like contact, the contacts being provided alternately on the lateral faces of the bus terminals and engaging one another in the transverse direction when the bus terminals are mounted on the support rail.

* * * * *